United States Patent
Nguyen et al.

(10) Patent No.: US 10,112,496 B2
(45) Date of Patent: Oct. 30, 2018

(54) VEHICULAR WIRELESS POWER TRANSFER SYSTEM WITH PERFORMANCE MONITORING

(71) Applicant: DENSO International America, Inc., Southfield, MI (US)

(72) Inventors: Trong-Duy Nguyen, Novi, MI (US); Christopher Jeffery White, Lasalle (CA)

(73) Assignee: DENSO International America, Inc., Southfield, MI (US)

( * ) Notice: Subject to any disclaimer, the term of this patent is extended or adjusted under 35 U.S.C. 154(b) by 149 days.

(21) Appl. No.: 15/207,925

(22) Filed: Jul. 12, 2016

(65) Prior Publication Data

US 2018/0015832 A1 Jan. 18, 2018

(51) Int. Cl.
| | |
|---|---|
| *B60L 11/18* | (2006.01) |
| *H02J 7/02* | (2016.01) |
| *H02J 50/10* | (2016.01) |
| *H02J 50/90* | (2016.01) |
| *G01R 19/00* | (2006.01) |

(52) U.S. Cl.
CPC ......... *B60L 11/182* (2013.01); *B60L 11/1811* (2013.01); *B60L 11/1838* (2013.01); *B60L 11/1848* (2013.01); *G01R 19/0084* (2013.01); *H02J 7/025* (2013.01); *H02J 50/10* (2016.02); *H02J 50/90* (2016.02); *Y02T 90/125* (2013.01)

(58) Field of Classification Search
CPC . B60L 11/182; B60L 11/1811; B60L 11/1838; H02J 5/005; H02J 7/025; H02J 17/00; H02J 50/10; H02J 50/12; H02J 50/90; Y02T 90/125

USPC .......................................... 307/9.1, 10.1, 104
See application file for complete search history.

(56) References Cited

U.S. PATENT DOCUMENTS

| | | | |
|---|---|---|---|
| 5,821,731 A | 10/1998 | Kuki et al. | |
| 7,023,177 B1 | 4/2006 | Bussinger | |
| 8,810,205 B2 | 8/2014 | Ichikawa | |
| 8,975,864 B2 | 3/2015 | Kim | |

(Continued)

FOREIGN PATENT DOCUMENTS

| | | | |
|---|---|---|---|
| JP | 2014030329 A | 2/2014 | |
| JP | 2014082339 A | 5/2014 | |

(Continued)

*Primary Examiner* — Levi Gannon
(74) *Attorney, Agent, or Firm* — Harness, Dickey & Pierce, P.L.C.

(57) ABSTRACT

A wireless power transfer system for charging a battery positioned in a vehicle may include a primary side network, a secondary side network, detection coils, and a charge monitor controller. The secondary side network may be configured to receive power from the primary side network by way of inductively coupling between a transmitting coil of the primary side network and a receiving coil of the secondary side network. The detection coils may be coupled to magnetic cores provided with at least one of the primary side network or the secondary side network. The detection coils may output at least one voltage signal based on the inductively coupling between the transmitting coil and the receiving coil. The charge monitor controller may determine a system diagnosis status based on the at least one voltage signal from the detection coils.

15 Claims, 6 Drawing Sheets

(56) References Cited

U.S. PATENT DOCUMENTS

| | | | |
|---|---|---|---|
| 2010/0244582 A1* | 9/2010 | Yoshikawa | H02J 7/025 307/104 |
| 2011/0004278 A1* | 1/2011 | Aghassian | A61N 1/3787 607/61 |
| 2011/0127846 A1* | 6/2011 | Urano | H02J 17/00 307/104 |
| 2012/0091959 A1 | 4/2012 | Martin et al. | |
| 2013/0024059 A1* | 1/2013 | Miller | H02J 50/12 701/22 |
| 2013/0169062 A1 | 7/2013 | Maikawa et al. | |
| 2013/0270921 A1* | 10/2013 | Boys | H01F 38/14 307/104 |
| 2014/0055088 A1* | 2/2014 | Joshi | H02J 7/025 320/108 |
| 2014/0132207 A1 | 5/2014 | Fisher | |
| 2014/0132208 A1 | 5/2014 | Fisher | |
| 2014/0239890 A1 | 8/2014 | Patwardhan | |
| 2015/0102685 A1* | 4/2015 | Blood | H02J 5/005 307/104 |
| 2015/0137801 A1* | 5/2015 | Raedy | H02J 50/12 324/207.15 |
| 2016/0218520 A1* | 7/2016 | Mehas | H02J 50/12 |
| 2016/0218559 A1* | 7/2016 | Mehas | H02J 5/005 |

FOREIGN PATENT DOCUMENTS

| | | |
|---|---|---|
| WO | WO-2011049352 A3 | 9/2011 |
| WO | WO-2012165244 A1 | 12/2012 |
| WO | WO-2014004551 A1 | 1/2014 |

\* cited by examiner

VEHICULAR WIRELESS POWER TRANSFER SYSTEM WITH PERFORMANCE MONITORING

FIELD

The field of the invention relates to a wireless power transfer system for charging a battery in a vehicle.

BACKGROUND

This section provides background information related to the present disclosure, which is not necessarily prior art.

In an effort to reduce fossil fuel emissions and other pollutants emitted from automobiles that use internal combustion engines, hybrid electric automobiles (HEV) and electric automobiles (EV) have been designed and implemented to mitigate the environmental effects of the internal combustion engine. In order to provide power to these battery systems, the HEVs and EVs may be provided with power by connecting to the electrical grid. The battery system of an HEV or EV may be connected to the electrical grid by using a copper cable. Typically, the copper cable will have one end that has a plug, thus allowing the battery system to connect to the electrical grid.

The battery system of an HEV or EV may also connect to the electrical grid by implementing a wireless or contactless charging system. A wireless charging system, which may also be referred to as a wireless power transfer (WPT) system, may utilize the mutual inductance between two inductive coils to provide power to the battery system of the HEV or EV. The electrical grid may induce a voltage at a first coil, and as a result of the inductive coupling between the first coil and a second coil connected to the battery system of the HEV or EV, the second coil will induce a voltage and subsequently charge the battery system of the HEV or EV.

While the wireless charging system has the advantage of not requiring cables, connectors, and plugs, the wireless charging system often has low power efficiency. The efficiency of wireless charging systems may be affected by a coil misalignment between the transmitting coils and the receiving coils. For example, the receiving coil may be misaligned with the transmitting coil. A misalignment may increase the distance between the two coils, and consequently, decrease the mutual inductance between the coils. A decrease in mutual inductance reduces the overall power efficiency of the WPT system.

SUMMARY

This section provides a general summary of the disclosure, and is not a comprehensive disclosure of its full scope or all of its features. The present disclosure is generally directed toward a wireless power transfer system for charging a battery disposed in a vehicle. The wireless power transfer system may include a primary side network, a secondary side network, detection coils for sensing electric power between the primary side network and the secondary side network, and a charge monitor controller for determining a system diagnosis status of the wireless power transfer system based on the electric power sensed by the detection coils.

The primary side network may include including a transmitting coil and a plurality of primary magnetic cores. The transmitting coil may be coupled to the plurality of primary magnetic cores, and may be configured to receive power from a power supply.

The secondary side network may include a receiving coil and a plurality of secondary magnetic cores. The receiving coil may be coupled to the plurality of secondary magnetic cores, and may be configured to receive power from the primary side network by way of inductively coupling between the transmitting coil and the receiving coil.

The detection coils may be coupled to at least one of the primary magnetic cores or the secondary magnetic cores. The detection coils may output at least one voltage signal based on the inductively coupling between the transmitting coil and the receiving coil. The charge monitor controller may determine the system diagnosis status based on the at least one voltage signal from the detection coils.

In an aspect of the present disclosure, the charge monitor controller may determine whether the transmitting coil and the receiving coils are misaligned, as the system diagnosis status, based on the voltage signals from the detection coils.

Further areas of applicability of the present disclosure will become apparent from the detailed description, the claims, and the drawings. The detailed description and specific examples are intended for purposes of illustration only, and are not intended to limit the scope of the disclosure.

BRIEF DESCRIPTION OF THE DRAWINGS

The drawings described herein are for illustrative purposes only of selected embodiments and not all possible implementations, and are not intended to limit the scope of the present disclosure.

In the drawings, reference numbers may be reused to identify similar and/or identical elements.

DETAILED DESCRIPTION

To improve the efficiency of a wireless power transfer (WPT) system, the performance of the WPT system may be monitored to determine, for example, whether coils of the system are misaligned. A WPT system of the present disclosure monitors the power transmitted between the transmitting coil and the receiving coil and the alignment between the coils to assess the performance of the WPT system. In an example embodiment, the WPT system includes detection coils that sense the inductive coupling between the transmitting coil and the receiving coil to determine a system diagnosis status (i.e., a system health status) of the WPT system. For example, the detection coils may be used to determine the alignment of the coils as the system diagnosis status. Information regarding the performance of the WPT system is utilized by a controller to control the system to ensure efficient and safe operation of the WPT system.

Example embodiments will now be described more fully with reference to the accompanying drawings.

Figure 1:
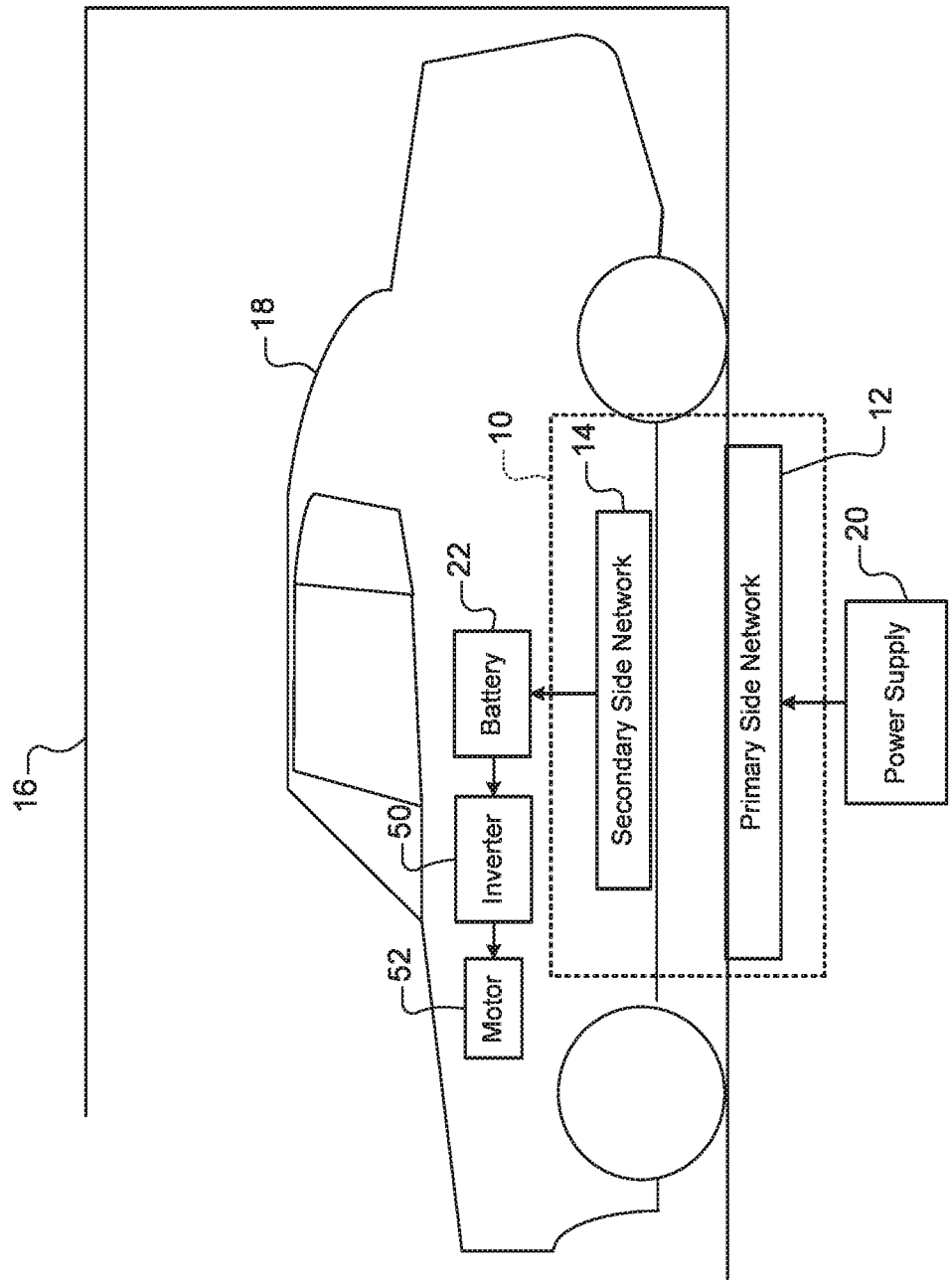
FIG. 1 is a functional block diagram of a vehicle being charged by a wireless power transfer (WPT) system of the present disclosure.
Figure 2:
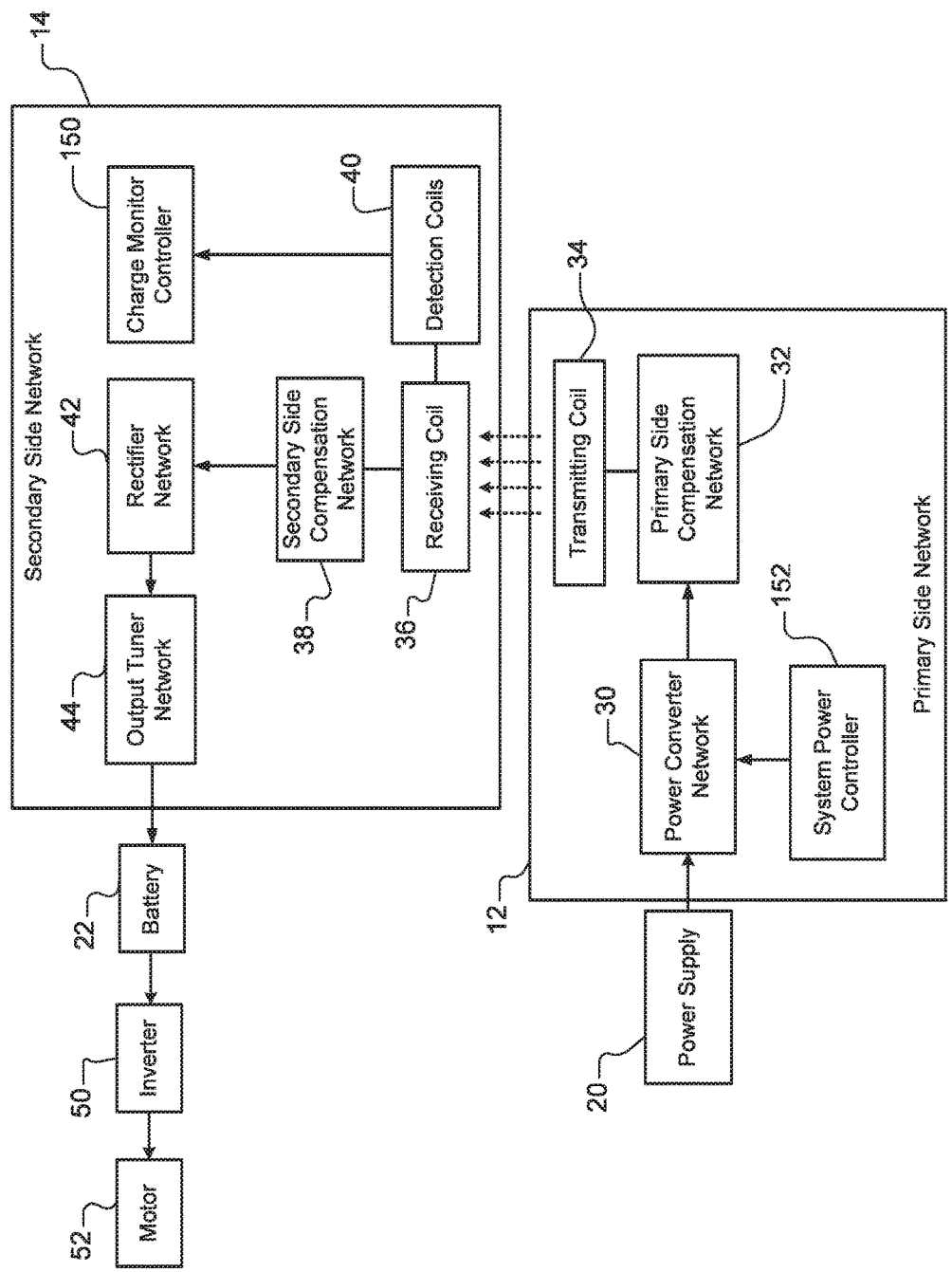
FIG. 2 is an example block diagram of the WPT system including a primary side network and a secondary side network.

With reference to FIGS. 1 and 2, in an example embodiment, a WPT system 10 may include a primary side network 12 and a secondary side network 14. The primary side network 12 may be provided in a garage 16 at a home, and the secondary side network 14 may be positioned in a vehicle 18. The primary side network 12 is configured to receive electrical power from a power supply 20 and to induce an electric current through the secondary side network 14. The power supply 20 may supply, for example, a direct-current (DC) power or an alternating-current (AC) power from an electrical grid.

The secondary side network 14 supplies power to a battery 22 based on the electric current induced in the secondary side network 14. Accordingly, the WPT system 10 wirelessly charges the battery 22 of the vehicle. While the primary side network 12 is described as being in a garage, the primary side network 12 may be implemented at a charging station, located at, for example, a gas station, a rest area, and/or a location other than the home.

With reference to FIG. 2, the primary side network 12 includes a power converter network 30, a primary side compensation network 32, and a transmitting coil 34. The secondary side network 14 may include a receiving coil 36, a secondary side compensation network 38, one or more detection coils 40, a rectifier network 42, and an output tuner network 44. The primary side network 12 may be positioned along a surface or just below the surface upon which the vehicle 18 is standing. For example, the primary side network 12 may be provided as a charge pad positioned on the surface of the garage 16. The secondary side network 14 may be positioned along an underside of the vehicle 18, such that the receiving coil 36 is configured to face the transmitting coil 34.

In the example embodiment, the power converter network 30 converts DC power from the power supply 20 to an input AC signal. Alternatively, in the event that the power supply 20 supplies AC power, the power converter network 30 may convert the AC power to an input AC signal having a desired amplitude and frequency. The primary side compensation network 32 may mitigate leakage inductance of the WPT system 10. The transmitting coil 34 transfers power to the secondary side network 14 by way of inductive coupling between the transmitting coil 34 and the receiving coil 36 of the secondary side network 14.

The receiving coil 36 receives power from the transmitting coil 34 as a result of the inductive coupling between the transmitting coil 34 and the receiving coil 36. The secondary side network 14 is configured to mitigate leakage inductance of the WPT system 10. The rectifier network 42 converts the AC signal from the receiving coil 36 to a DC signal. The output tuner network 44, which may couple the rectifier network 42 to the battery 22 of the vehicle, provides a voltage at a resonant frequency. The DC signal outputted by the secondary side network 14 charges the battery 22 of the vehicle 18.

The battery 22 may output a DC signal to an inverter 50 that converts the DC signal of the battery 22 to an AC signal for driving a motor 52. In other embodiments, the vehicle 18 may include a DC motor, and therefore, the inverter 50 may be removed. Accordingly, the DC signal from the battery 22 may be directly supplied to the DC motor.

The one or more detection coils 40 may be coupled to the receiving coil 36. The detection coils 40 senses an induced voltage that is indicative of the inductive coupling between the primary side network 12 and the secondary side network 14. The detection coils 40 output a signal that is representative of the induced voltage, and is used to determine a system diagnosis status of the WPT system 10, as discussed in detail herein.

Figure 3:
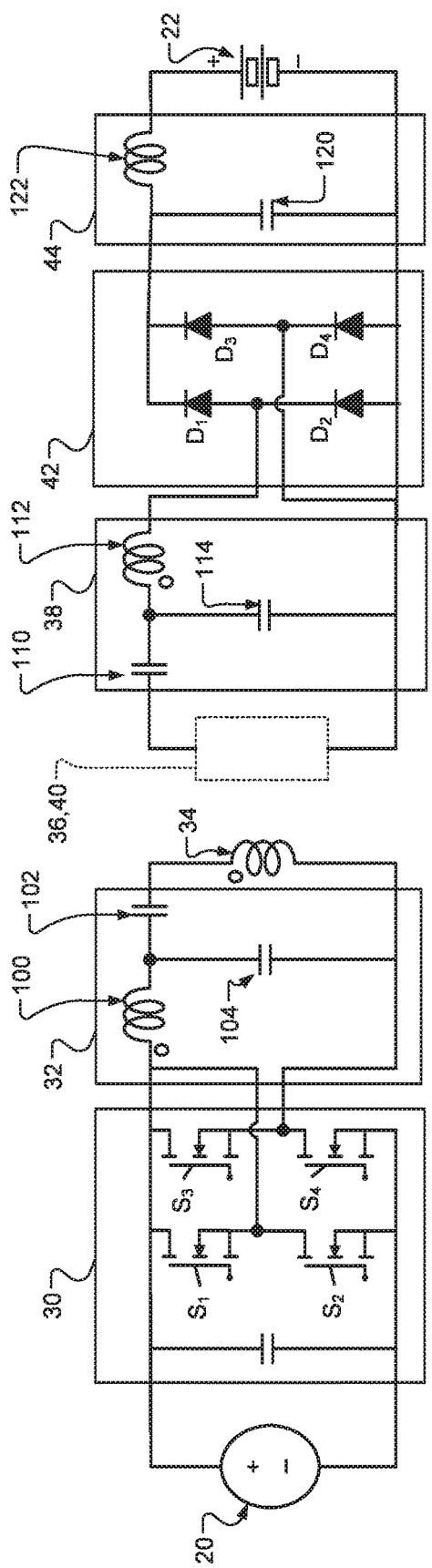
FIG. 3 is an example circuit diagram of the WPT system with detection coils.

FIG. 3 is an example circuit diagram of the WPT system 10 with the detection coils 40. In the example embodiment, the power converter network 30 may include an inverter network that converts the DC power from the power supply 20 to the input AC signal at the desired resonant frequency. The inverter network may be a full bridge converter circuit comprising four power MOSFETs $S_1 \sim S_4$.

In an alternative embodiment, the power converter network 30 may include a rectifier and an inverter network to convert AC power from the power supply 20 to the input AC signal at the desired resonant frequency. For example, the rectifier converts the input AC signal from the power supply 20 into a pulsating DC signal. The rectifier may be implemented to increase an average amount of power that is delivered to the transmitting coil 34. The inverter network converts the pulsating DC signal into the input AC signal.

The primary side compensation network 32 couples the power converter network 30 to the transmitting coil 34. In the example embodiment, the primary side compensation network 32 includes a primary compensation coil 100, a primary series capacitor 102, and a primary parallel capacitor 104. The primary compensation coil 100, the primary series capacitor 102, and the transmitting coil 34 are coupled in series. The primary parallel capacitor 104 is coupled in parallel to the transmitting coil 34. The primary compensation coil 100 may be chosen to minimize the cross coupling amongst other coils in the WPT system 10 and to make the WPT system 10 compact in size.

The transmitting coil 34 inductively couples to the receiving coil 36 of the vehicle 18 when the transmitting coil 34 receives the alternating current. Consequentially, the transmitting coil 34 delivers power to the receiving coil 36 wirelessly.

The secondary side compensation network 38 couples the receiving coil 36 to the rectifier network 42. In the example embodiment, the secondary side compensation network 38 includes a secondary compensation coil 112, a secondary series capacitor 110, and a secondary parallel capacitor 114. The secondary compensation coil 112, the secondary series capacitor 110, and the receiving coil 36 are coupled in series. The secondary parallel capacitor 114 is coupled in parallel to the receiving coil 36. The secondary compensation coil 112 may be chosen to minimize the cross coupling amongst other coils in the WPT system 10 and to make the WPT system 10 compact in size.

The rectifier network 42 may include a plurality of switching components to convert the AC signal of the receiving coil 36 to a DC signal. Four switching components may be used to perform the rectification, provided that the switching components are arranged in a bridge configuration. In other embodiments, two switching components may be used with a center tapped transformer to perform the rectification. The switching components may comprise diodes, MOSFETs, or bipolar junction transistors. In one embodiment, the rectifier network 42 comprises a full bridge converter circuit with four diodes $D_1 \sim D_4$.

The DC signal from the rectifier network 42 may then be delivered to the output tuner network 44, which is configured to reduce ripple voltages and ripple currents of the output DC signal. The output tuner network 44 provides a voltage at the resonant frequency to the battery 22. In the example embodiment, the output tuner network 44 includes a tuning capacitor 120 and a tuning inductor 122 coupled in series. The inductance of the tuning inductor 122 and the capacitance of the tuning capacitor 120 may be selected such that the square root of the product of the inductance and the capacitance is equal to the resonant frequency. The DC signal may then be delivered to the battery 22.

While specific components are described for implementing the primary side network 12 and the secondary side network 14, it is readily understood that the primary side network 12 and the secondary side network 14 may be configured in other suitable ways, and should not be limited to the components describe herein. For example, the power converter network 30 may be part of a frequency converter network in which the frequency of the signal from the power supply may be changed while maintaining the voltage amplitude. Accordingly, the frequency converter network may include a three-phase PWM AC-AC converter or a direct frequency converter with either a voltage source inverter (VSI) or a current source inverter (CSI). As another example, the inverter network for the power converter network 30 may also be a full bridge converter comprising four bipolar junction transistors. In yet another example, a relay module (not shown) may couple the receiving coil 36 and the secondary side compensation network 38 to isolate the secondary side compensation network 38 from the receiving coil 36 when the receiving coil 36 is not receiving power from the primary side network 12.

The WPT system 10 also includes a charge monitor controller 150 and a system power controller 152. The charge monitor controller 150 and the system power controller 152 may be communicably coupled via a wired and/or wireless communication link. For example, the charge monitor controller 150 and the system power controller 152 may communicate by way of Bluetooth, Wifi, or other suitable wireless link. The charge monitor controller 150 analyzes the voltage signal from the detection coils 40 to determine a system diagnosis status (i.e., a system health status), and may transmit information regarding the system diagnosis status of the WPT system 10 to the system power controller 152. For example, based on the voltage signal from the detection coils 40 and pre-stored data, the charge monitor controller 150 may determine: whether the transmitting coil 34 and the receiving coil 36 are misaligned; whether the electromagnetic field between the primary side network 12 and the secondary side network 14 is within a predetermined operation range; and other suitable information indicative of an operating state of the WPT system 10.

Based on the information received, the system power controller 152 may control the power being supplied from the power supply 20 to the primary side network 12. More particularly, the system power controller 152 may store information that associates a specific system diagnosis status of the WPT system 10 with a recommended action for addressing the diagnosis status, so that the WPT system 10 operates effectively and safely. As an example, if the transmitting coil 34 and the receiving coil 36 are misaligned, the system power controller 152 may output a warning by way of display and/or or audio system to notify the user of the WPT system 10 that the position of the vehicle 18 may need to be adjusted to properly align with the transmitting coil 34. In another example, if the magnetic field of the WPT system 10 is unstable, the system power controller 152 may reduce the power being received from the power supply 20 by way of the power converter network 30 and/or a switch (not shown) positioned between the power supply 20 and the primary side network 12.

In the example embodiment, the charge monitor controller 150 and the detection coils 40 are part of the secondary side network 14. Alternatively, the detection coils 40 and the charge monitor controller 150 may be provided on the primary side network 12. For example, the detection coils 40 may be arranged with the transmitting coil 34 and the charge monitor controller 150 may receive signals from the detection coils 40 to determine the condition of the WPT system 10. If the detection coils 40 are provided with the transmitting coil 34, the charge monitor controller 150 may be combined with the system power controller 152.

In another example, both the primary side network 12 and the secondary side network 14 may include detection coils. In other words, one set of detection coils may be provided with the receiving coil 36 and another set of detection coils may be provided with the transmitting coil 34. Accordingly, the WPT system 10 may include two charge monitor controllers, where one charge monitor controller is positioned with the secondary side network 14 and the other charge monitor controller is provided with the primary side network 12.

Figure 4:
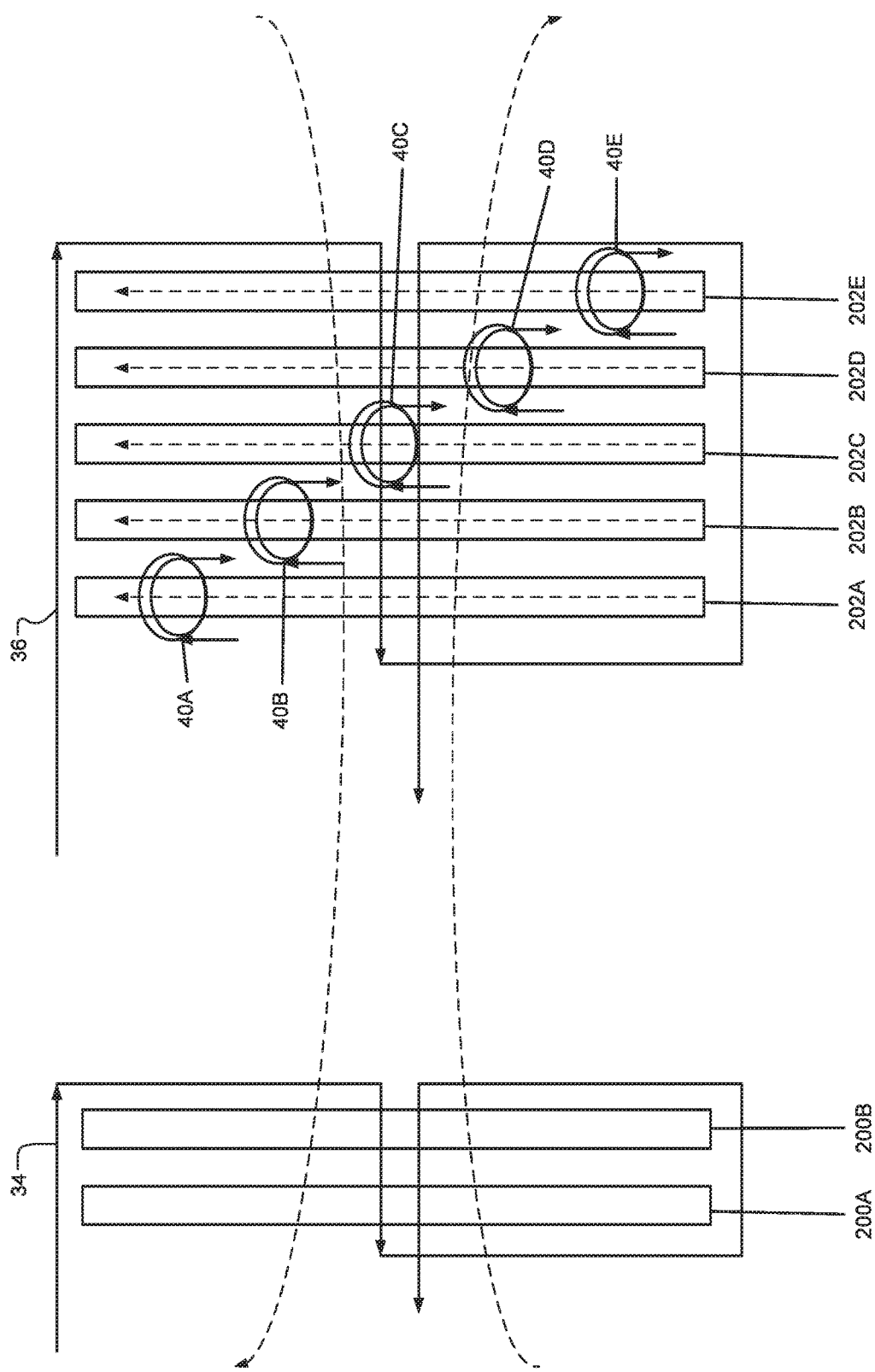
FIG. 4 illustrates the detection coils positioned with the receiving coil of the WPT system.

FIG. 4 illustrates an example implementation of the transmitting coil 34, the receiving coil 36, and the detection coils 40 of the WPT system 10. The transmitting coil 34 is coupled to one or more primary magnetic cores 200 (i.e., cores 200A and 200B) by winding the transmitting coil 34 around each surface of the primary magnetic cores 200, which may be made of a ferrite magnetic material. The receiving coil 36 may be coupled to secondary magnetic cores 202 (i.e., cores 202A-202E) by winding the receiving coil 36 around each surface of the secondary magnetic cores 202, which may be made of a ferrite magnetic material.

In the example embodiment, the detection coils 40 are provided with the receiving coil 36 and are coupled to the secondary magnetic cores 202 (i.e., magnetic cores 202A-202E). One detection coil 40 may be provided with each of the secondary magnetic cores 202, and wound around the respective magnetic core 202. The detection coil 40 may be wound around the magnetic cores 202 N-number of times, where N is an integer (e.g., 1, 3, 5, etc.). The number of detection coils 40 in the WPT system 10 should not be limited to the number of secondary magnetic cores 202. For example, in an alternate embodiment, more than one detection coil may be provided at a single magnetic core 202. In yet another embodiment, not every magnetic core 202 may have a detection coil, and thus, the number of detection coils may be less than the number of magnetic cores 202.

The position of a given detection coil 40 of the secondary magnetic cores 202 should not be limited to the figures herein. For example, the detection coils 40 may be spaced an equal distance apart from each other along the secondary magnetic cores 202. Thus, a first detection coil 40 is separated from a second detection coil 40 adjacent to the first detection coil at a fixed distance. Alternatively, the distance between each detection coil may not be equal.

The detection coils 40 sense an induced voltage in response to the transmitting coil 34 receiving power from the power supply 20 and a magnetic field being generated between the transmitting coil 34 and the receiving coil 36. Specifically, when the transmitting coil 34 receives power, the transmitting coil 34 induces a current, not only in the receiving coil 36, but also in the detection coils 40. Accordingly, a voltage is induced in the detection coils 40 as a result of the inductive coupling of each detection coil 40 to the transmitting coil 34. Thus, the voltage induced in the detection coils 40 is based on the inductive coupling between the transmitting coil 34 and the receiving coil 36.

The positions of the detection coils 40 along the secondary magnetic cores 202 can be used to monitor the magnetic field between the primary side network 12 and the secondary side network 14. More particularly, a relative position of a given secondary magnetic core 202 among the other magnetic cores 202 of the receiving coil 36 is predefined and unique. Accordingly, the position of a given detection coil 40 on a respective magnetic core 202 is also unique. Thus, the WPT system 10 can detect the induced voltage at a specific location by way of the detection coils 40, as described herein.

With the unique position of the detection coils 40, the combination of induced voltage signals sensed from the detection coils 40 may also be unique. As an example, when the transmitting coil 34 and the receiving coil 36 are aligned or substantially aligned, the magnetic field is substantially symmetric, and therefore the induced voltages at the detection coils 40 may have similar symmetric relationship. When the receiving coil 36 and the transmitting coil 34 are misaligned, the magnetic field is off-center or biased toward the receiving coil 36, and therefore, the induced voltages at the detection coils may be skewed.

For example, with continuing reference to FIG. 4, when the transmitting coil 34 is predominately aligned with detection coil 40A, the magnetic field near the detection coil 40A may be stronger than the magnetic field near detection coils 40B-40E. Accordingly, the detection coil 40A may experience a stronger induced voltage than that of the detection coils 40B-40E.

The position of the detection coils 40A and the induced voltage at the detection coils 40 can be used as a voltage signature for determining the system diagnosis status of the WPT system 10. Generally, the operating conditions of the WPT system 10 can vary the magnetic field and therefore, vary the induced voltage sensed by the detection coils 40. Accordingly, different combination of voltage signatures for the detection coils 40 may reflect different operating conditions of the WPT system 10, and thus, can be used to determine the system diagnosis status.

Figure 5:
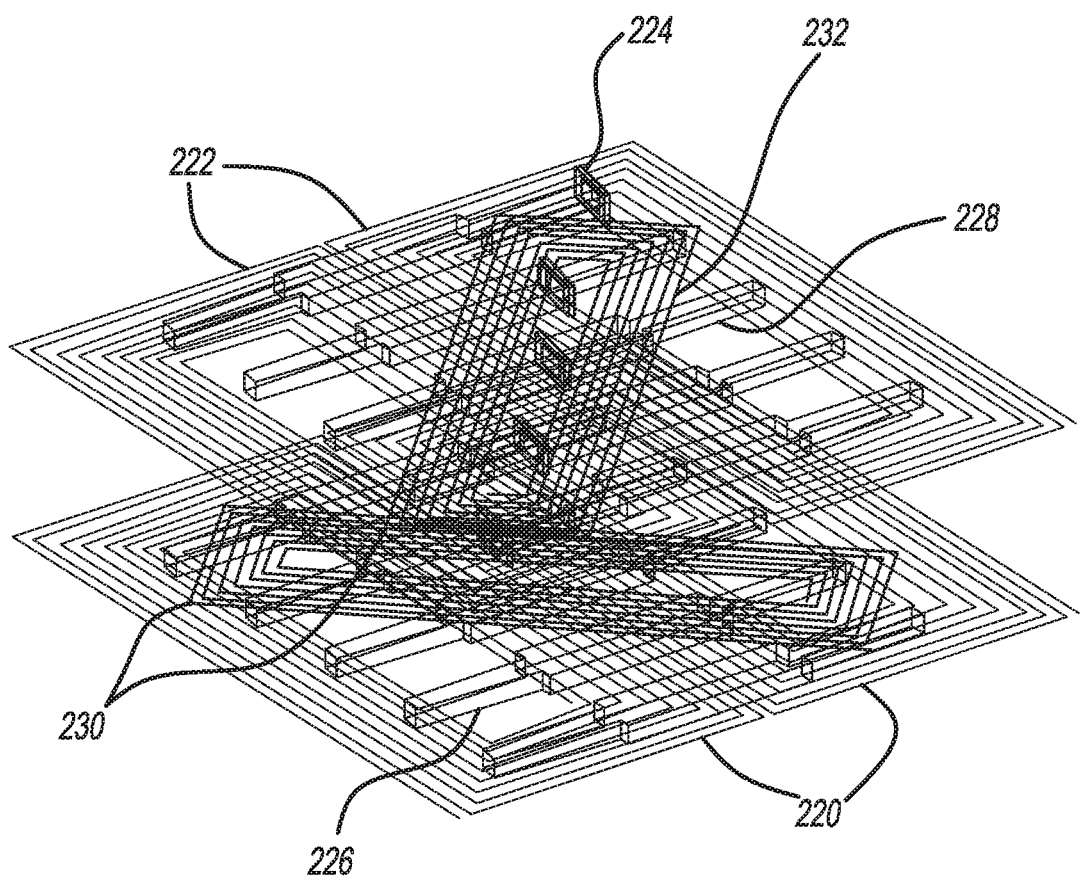
FIG. 5 illustrates an example physical embodiment of the transmitting coil, the receiving coil, and the detection coils of the WPT system.

FIG. 5 illustrates an example physical embodiment of a transmitting coil 220, a receiving coil 222, and detection coils 224. The embodiment illustrated in FIG. 5 may be used with the WPT system 10 of FIG. 1. The transmitting coil 220 is coupled to multiple primary magnetic cores 226. The receiving coil 222 is coupled to multiple secondary magnetic cores 228. The magnetic cores 226 and 228 may be made of magnetic ferrite bars. The detection coils 224 are coupled to the secondary magnetic cores 228 and the receiving coil 222. A primary compensation coil 230 is serially coupled to the transmitting coil 220, and a secondary compensation coil 232 is serially coupled to the receiving coil 222. The implementation provided in FIG. 5 is only an example, and should not limit the scope of the present disclosure.

The charge monitor controller 150 is electrically coupled to the detection coils 40 to detect the induced voltage at the detection coils and convert the detected induced voltage to one or more voltage values. The charge monitor controller 150 determines a current system diagnosis status, such as coil misalignment or normal operation, based on the voltage values and predetermined performance data.

Figure 6:
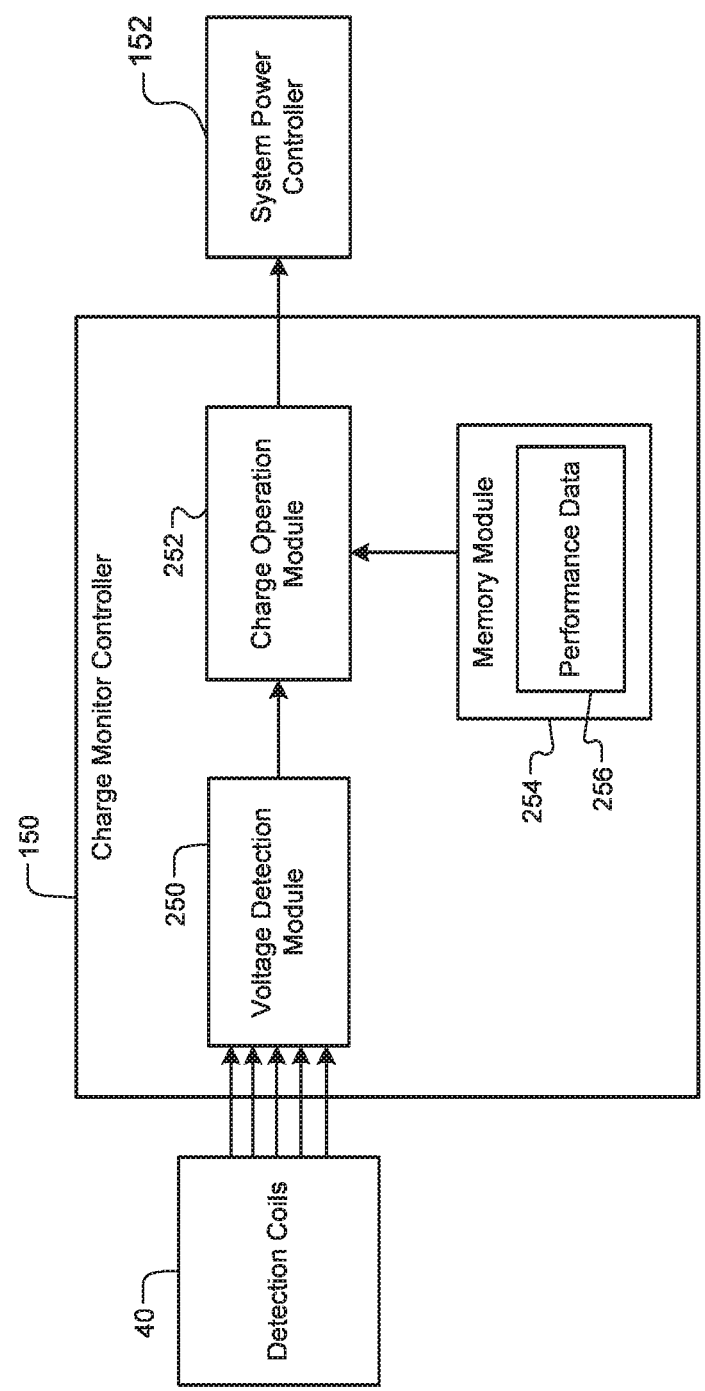
FIG. 6 is an example block diagram of a charge monitor controller of the WPT system.

With reference to FIG. 6, an example implementation of the charge monitor controller 150 is provided. The charge monitor controller 150 may include a voltage detection module 250, a charge operation module 252, and a memory module 254. The voltage detection module 250 detects the induced voltage from the detection coils and determines the amount of voltage induced at a respective detection coil 40. Accordingly, the voltage detection module 250 may include an input/output interface that couples to the detection coils 40, an analog-digital converter, and other suitable components for receiving and converting the detected voltage to a digital voltage value. The voltage detection module 250 associates each voltage value with a respective detection coil 40 that is located at a unique position of the core 202 as a voltage signature of the respective detection coil 40.

The charge operation module 252 determines a system diagnosis status based on the voltage signatures from the voltage detection module 250 and predetermined performance data 256 stored in the memory module 254. The performance data 256 stored in the memory module 254 associate multiple unique combinations of voltage values from the detection coils 40 with one or more system diagnosis status. More particularly, during the design and development of a WPT system, the system may undergo a series of tests that evaluate the performance of the system during various operating conditions (e.g., extreme temperatures, humidity, coil misalignment, etc.). The voltage values induced at the detection coils 40 may be stored in association with the respective operating condition and with one or more system diagnosis statuses as the performance data 256.

The performance data 256 can be provided as a series of lookup tables that associates different operating conditions with detected voltage values at each of the detection coils 40 and one or more system diagnosis statuses. The performance data 256 may also include data that associates system diagnosis statuses with voltage diagnostic thresholds for a respective system diagnosis status.

The charge operation module 252 may determine the current system diagnosis status of the WPT system 10 based on the voltage signatures and the performance data 256. The charge operation module 252 may be configured in various suitable ways for determining the current system diagnosis status. For example, the charge operation module 252 may compare the voltage signatures received from the voltage detection module 250 with the voltage values stored in the performance data 256 and then select a system diagnosis status that is associated with stored voltage values similar to voltage signatures, as the current system diagnostic status.

Alternatively, the charge operation module 252 may be configured to store and execute a series algorithm and/or processes that compare the voltage signatures with one or more voltage diagnostic thresholds stored in association with one or more system diagnosis statuses. If the voltage signatures exceeds a given voltage threshold, the charge operation module 252 may then determine the system diagnosis status of the WPT system 10. For example, the performance data 256 may store an induced voltage diagnostic threshold for each of the detection coils for identifying when the transmitting coil 34 and the receiving coil 36 are properly aligned. If one or more of the voltage signatures exceeds a respective induced voltage diagnostic threshold, the charge operation module 252 may determine that the current system diagnosis status of the WPT system 10 as being misalignment between the transmitting coil 34 and the receiving coil 36.

Furthermore, based on the voltage signatures and the induced voltage diagnostic thresholds, the charge operation module 252 may determine the direction in which the transmitting coil 34 and the receiving coil 36 are misaligned. For example, as discussed above, if the voltage signatures, which indicate the unique position of a voltage value, indicate a skewed or asymmetrical pattern, the charge operation module 252 can determine the direction in which the coils are offset from each other.

The charge operation module 252 may output the current system diagnosis status to the system power controller 152 for addressing the system diagnosis status. The system power controller 152 may include a memory that stores predefined actions for each system diagnosis status. An action can be as simple as continued operation if the system diagnosis status indicates that the WPT system 10 is operating normally or can include transmitting warning messages to an operator of the WPT system 10 when the WPT system is behaving abnormally and may require a maintenance check.

As an example, if the system diagnosis status indicates that the transmitting coil 34 and the receiving coil 36 are misaligned, the system power controller 152 may increase the amount of power being supplied to the transmitting coil 34 by controlling the operation of the power converter network 30 in order to increase the strength of the magnetic field. Alternatively, the system power controller 152 may be configured to control the position of the transmitting coil 34, and therefore may adjust the position of the transmitting coil 34 so that it aligns with the receiving coil 36. In another example, if the system diagnosis status indicates that the amount of power in the WPT system 10 is too high, the system power controller 152 may electrically decouple the power converter network 30 from the power supply 20, and issue a notification, such as a warning message to an operator of the WPT system 10, to inform them that the WPT system is operating at an unsafe level.

In addition to notifying the system power controller 152, the charge monitor controller 50 may also notify the user of the vehicle. For example, the change monitor controller 150 may be in wired and/or wireless communication with a control module in the vehicle when the coils 34 and 36 are misaligned, the charge monitor controller 150 may transmit a notification to the control module, which then issues a message that can be displayed on a display provided in the passenger cabin of the vehicle. The display may be a liquid crystal display, a visual indicator on a dashboard similar to a "CHECK ENGINE" light, or other similar devices. The user may subsequently be able to adjust the positioning of the vehicle to reduce the misalignment, thus increasing the overall efficiency of the WPT system 10.

In the example embodiment, the detection coils 40 are used to monitor the inductive coupling between the transmitting coil 34 and the receiving coil 36. Alternatively, the detection coils 40 may be removed, and the secondary compensation coil may be used to monitor the inductive coupling. As a result of the mutual inductance between the transmitting coil 34 and the secondary compensation coil 112, the secondary compensation coil 112 may detect a voltage as a result of the transmitting coil 34 receiving power from the power supply 20 and provide the voltage signal to the charge monitor controller 150.

As another example, the detection coils 40 may be removed, and the primary compensation coil may be used to monitor the magnetic field. The voltage of the primary compensation coil 100 may be unique based on the arrangement of the compensation coil of the core. The charge monitor controller 150 receives the voltage signal from the compensation coil 100 to determine the system diagnosis status.

The WPT system 10 of the present disclosure monitors the electric power being exchanged between the transmitting coil and the receiving coil together with detecting the alignment between the transmitting coil and the receiving coil. The WPT system 10 can detect an abnormality in the charge operation and further control the transmitting side network to ensure the system is operating safely and efficiently.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The apparatuses and methods described herein may be implemented by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

What is claimed is:

1. A wireless power transfer system for a vehicle, the system comprising:
   a primary side network including a transmitting coil and a plurality of primary magnetic cores, wherein the transmitting coil is coupled to the plurality of primary magnetic cores, and the transmitting coil is configured to receive power from a power supply;
   a secondary side network including a receiving coil and a plurality of secondary magnetic cores, wherein the receiving coil is coupled to the plurality of secondary magnetic cores, and the secondary side network is configured to receive power from the primary side network by way of inductively coupling between the transmitting coil and the receiving coil;
   a plurality of detection coils coupled to at least one of the primary magnetic cores or the secondary magnetic cores, wherein the plurality of detection coils output at least one voltage signal based on the inductively coupling between the transmitting coil and the receiving coil; and
   a charge monitor controller determining a system diagnosis status based on the at least one voltage signal from the detection coils;
   wherein the charge monitor controller stores a predetermined performance data and determines whether the transmitting coil and the receiving coil are misaligned relative to one another as the system diagnosis status based on the voltage signals from the detection coils and the performance data; and
   wherein the plurality of detection coils are staggered along lengths of at least one of the primary magnetic cores and the secondary magnetic cores.

2. The wireless power transfer system of claim 1 wherein the detection coils are coupled and wound about the secondary magnetic cores.

3. The wireless power transfer system of claim 1 wherein the detection coils are coupled and wound about the primary magnetic cores.

4. The wireless power transfer system of claim 1 wherein the detection coils are coupled and wound about the primary magnetic cores and the secondary magnetic cores.

5. The wireless power transfer system of claim 1 wherein the charge monitor controller is communicably coupled to a control module in the vehicle and transmits a notification to the control module when the controller determines that the transmitting coil and the receiving coil are misaligned.

6. The wireless power transfer system of claim 1 wherein each of the detection coils is positioned at and wound around a designated magnetic core, the designated magnetic core is from among the at least one of the primary magnetic cores or the secondary magnetic cores.

7. The wireless power transfer system of claim 1 further comprising:
   a system power controller positioned with the primary side network, wherein the system power controller receives the system diagnosis status from the charge monitor controller and controls the power supplied to the transmitting coil based on the system diagnosis status.

8. The wireless power transfer system of claim 1 wherein:
   the charge monitor controller stores a predetermined performance data, the performance data associates multiple system diagnosis statuses with expected induced voltage values for one or more detection coils, and
   the charge monitor controller determines a present system diagnosis status from among the system diagnosis statuses provided in the performance data based on the voltage signals from the detection coils and the expected voltage values provided in the performance data.

9. The wireless power transfer system of claim 1 wherein:
   the plurality of detection coils includes a first set of detection coils coupled to and wound about the primary magnetic cores and a second set of detection coils coupled to and wound about the secondary magnetic cores,
   the first set of detection coils transmits a first set of voltage signals and the second set of detection coils transmits a second set of voltage signals to the charge monitor controller, and
   the charge monitor controller determines the system diagnosis status based on the first set and the second set of voltage signals from the first set of detection coils and the second set of detection coils, respectively.

10. A wireless power transfer system for charging a battery located in a vehicle, the wireless power transfer system comprising:
    a plurality of magnetic cores;
    a receiving coil coupled to the magnetic cores, wherein the magnetic cores and the receiving coil are disposed along an underside of the vehicle, and the receiving coil receives power from a transmitting coil located external to the vehicle;
    a plurality of detection coils wound about the magnetic cores, wherein the detection coils output voltage signals indicative of an induced voltage at a respective detection coil in response to the receiving coil receiving power from the transmitting coil; and
    a charge monitor controller electrically coupled to the detection coils and storing predetermined performance data, wherein the charge monitor controller determines a system diagnosis status based on the voltage signals from the detection coils and the performance data;

wherein the charge monitor controller determines that the receiving coil is misaligned with the transmitting coil, as the system diagnosis status, when the induced voltage at the detection coils is asymmetrical;

wherein the plurality of detection coils are staggered along lengths of different ones of the magnetic cores.

11. The wireless power transfer system of claim 10 wherein the performance data associates multiple system diagnosis statuses with expected induced voltage values for one or more of the detection coils, wherein the expected induced voltage values are indicative of an amount of induced voltage at the one or more of the detection coils for a respective system diagnosis status.

12. The wireless power transfer system of claim 10 wherein at least one detection coil is located at each of the magnetic cores.

13. The wireless power transfer system of claim 10 further comprising:

a system power controller operable to communicate with the charge monitor controller to receive the system diagnosis status from the charge monitor controller, wherein the system power controller controls the power supplied to the transmitting coil based on the system diagnosis status.

14. A method of monitoring an operating condition of a wireless power transfer system for a vehicle, the wireless power transfer system including a transmitting coil and receiving coil, the transmitting coil supplying power to the receiving coil via inductive coupling, the method comprising:

detecting, by a detection coil, an induced voltage at a predefined location of the wireless power transfer system;

outputting, by the detection coil, a voltage signal indicative of the induced voltage to a charge monitor controller;

determining, by the charge monitor controller, a voltage value indicative of the voltage signal from the detection coil located at the predefined location; and identifying, by the charge monitor controller, at least one system diagnosis status from among a plurality of system diagnosis statuses of the wireless power transfer system based on the voltage value detected at the predefined location and predetermined performance data stored by the charge monitor controller, wherein predetermined performance data stores a plurality of expected voltage values to be detected at the predefined location in association with one or more of the system diagnosis statuses;

wherein at least one of the plurality of system diagnosis statuses indicates that the transmitting coil and the receiving coil are misaligned relative to one another; and wherein the detection coil is one of a plurality of detection coils, each one of which is coupled to a different one of a plurality of magnetic cores and staggered along lengths of the plurality of magnetic cores.

15. The method of claim 14 further comprising:

controlling power supplied to the transmitting coil based on the at least one system diagnosis status identified by the charge monitor controller.

* * * * *